(12) United States Patent
Kuroda et al.

(10) Patent No.: US 8,174,599 B2
(45) Date of Patent: May 8, 2012

(54) IMAGE PICKUP APPARATUS HAVING CONTROL LINES CONNECTED TO ALTERNATE MATRIX ROWS

(75) Inventors: Yukihiro Kuroda, Kunitachi (JP); Chun-Hung Lien, Taipei (TW); Dong-Yang Lin, Yonghe (TW); Ching-Hsung Wang, Banqiao (TW)

(73) Assignee: Canon Kabushiki Kaisha, Tokyo (JP)

( * ) Notice: Subject to any disclaimer, the term of this patent is extended or adjusted under 35 U.S.C. 154(b) by 560 days.

(21) Appl. No.: 12/391,305

(22) Filed: Feb. 24, 2009

(65) Prior Publication Data
US 2009/0219420 A1 Sep. 3, 2009

(30) Foreign Application Priority Data
Feb. 28, 2008 (JP) ................................. 2008-047664

(51) Int. Cl.
*H04N 3/14* (2006.01)
*H04N 5/335* (2011.01)
*H01L 31/062* (2012.01)
*H01L 31/113* (2006.01)

(52) U.S. Cl. ......... 348/301; 348/308; 257/292; 257/294
(58) Field of Classification Search .................. 348/275, 348/281, 301–302, 308; 257/291–292, 294
See application file for complete search history.

(56) References Cited

U.S. PATENT DOCUMENTS

| 6,734,414 | B2 | 5/2004 | Street ............................ 250/208.1 |
| 6,930,299 | B2 * | 8/2005 | Ohkawa ...................... 250/208.1 |
| 6,992,714 | B1 | 1/2006 | Hashimoto et al. ........... 348/273 |
| 7,391,453 | B2 * | 6/2008 | Ohkawa ........................ 348/302 |
| 7,557,846 | B2 * | 7/2009 | Ohkawa ........................ 348/302 |
| 2004/0262494 | A1 * | 12/2004 | Egawa et al. ............... 250/208.1 |
| 2006/0043440 | A1 | 3/2006 | Hiyama et al. ................ 257/291 |
| 2006/0157760 | A1 * | 7/2006 | Hayashi et al. ............... 257/293 |
| 2007/0126039 | A1 * | 6/2007 | Ohta et al. .................... 257/291 |
| 2008/0029787 | A1 | 2/2008 | Watanabe et al. ............. 257/233 |
| 2008/0303930 | A1 | 12/2008 | Kuroda et al. ................ 348/308 |
| 2009/0008684 | A1 | 1/2009 | Kuroda ......................... 257/292 |

FOREIGN PATENT DOCUMENTS

| JP | 2000-341699 A | 12/2000 |
| JP | 2006-073733 A | 3/2006 |

* cited by examiner

*Primary Examiner* — Kelly L Jerabek
(74) *Attorney, Agent, or Firm* — Fitzpatrick, Cella, Harper & Scinto

(57) ABSTRACT

An image pickup apparatus which can photograph a high-definition image and a moving image of lower resolution at high quality and an image pickup system which uses the image pickup apparatus are provided. Unit pixel groups each of which comprises plural pixels including photoelectric conversion units and transfer transistors for transferring signal charges from the photoelectric conversion units, an amplification transistor common to the plural pixels, and the like are arranged in row and column directions. With respect to the plural unit pixel groups mutually adjacent in the row direction, control lines for controlling the transfer transistors respectively corresponding to the adjacent two photoelectric conversion units are alternately connected to an odd row and an even row in the row direction.

8 Claims, 8 Drawing Sheets

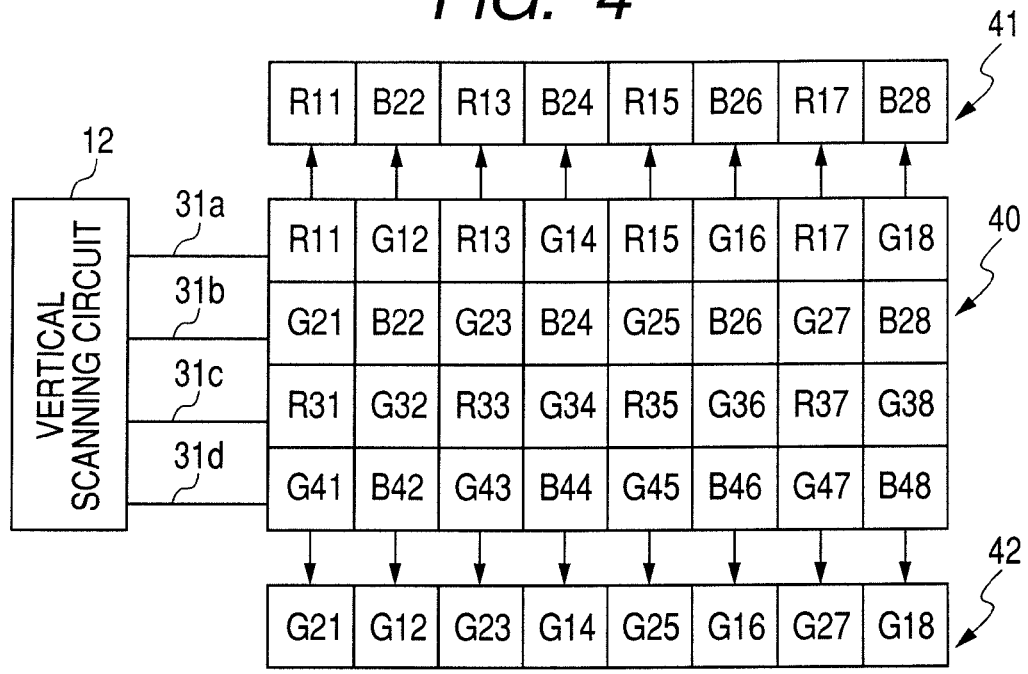
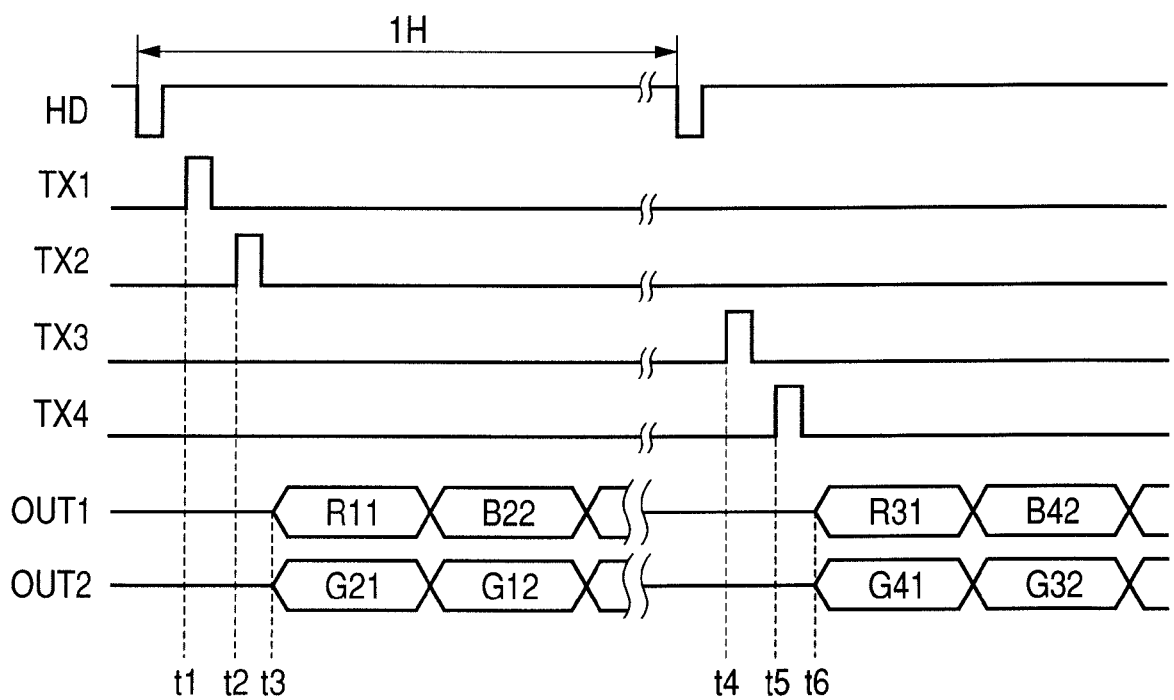

IMAGE PICKUP APPARATUS HAVING CONTROL LINES CONNECTED TO ALTERNATE MATRIX ROWS

BACKGROUND OF THE INVENTION

1. Field of the Invention

The present invention relates to an image pickup apparatus which is used for a digital still camera, a video camera and the like, and an image pickup system which uses the image pickup apparatus.

2. Description of the Related Art

In a digital still camera, an image pickup device having 10,000,000 pixels is used recently. Such an aspect is a result of pursuing image quality which is equivalent to that of a silver halide camera, and the digital still camera of this type is mainly used to handle still images. On the other hand, the number of pixels necessary to obtain moving images corresponding to a Full High Definition Television system is about 2,000,000.

For example, if the image pickup device having the 10,000,000 pixels is used to handle moving images, reading speed as much as five times of reading speed of the case of 2,000,000 pixels is necessary, and thus power consumption remarkably increases. In this case, there is a problem that noises increase due to the increase of the power consumption. Further, there is a problem of increasing costs due to the increase of the capacity of a memory to be used for image processing.

To solve the above-described problems, for example, a specific image pickup apparatus is disclosed in Japanese Patent Application Laid-Open No. 2000-341699. That is, in this apparatus, since signals of plural pixels are handled by a common amplifier, electrical charges of these signals are added and read at the input node of the common amplifier.

However, in the image pickup apparatus disclosed in Japanese Patent Application Laid-Open No. 2000-341699, the constitution for driving the pixels becomes complicated. Further, according to such complexity, the number of wirings necessary to drive the pixels increases, and thus an aperture ratio decreases. For these reasons, since the circuit constitution for driving the pixels increases in scale, the costs for this constitution increase. Further, since the sensitivity of the image pickup apparatus decreases, excellent image quality cannot be obtained.

Under such circumstances, for example, Japanese Patent Application Laid-Open No. 2006-073733 discloses an image pickup apparatus which can solve such problems. That is, in this apparatus, since a common amplifier is used for pixels of four rows and one column, it is unnecessary to increase wirings to be used for driving these pixels, and electrical charges of signals can be added to others on the pixels.

Further, U.S. Pat. No. 6,734,414 discloses a technique of connecting one gate line to a part of pixels on a certain line and of also connecting this gate line to a part of pixels on a line adjacent to the certain line, thereby dispersing noises correlating with the lines.

In the image pickup apparatus disclosed in Japanese Patent Application Laid-Open No. 2006-073733, the addition of the signals on the pixels is performed only in the vertical direction. However, since image information of each color after the addition comes not to have spatially equal intervals according to the arrangement of a color filter, there is a problem that resolution deteriorates. For this reason, it is required to add the pixel signals in a diagonal direction. That is, in the image pickup apparatus disclosed in Japanese Patent Application Laid-Open No. 2006-073733, to add the signals of the pixels adjacent in the diagonal direction (that is, the diagonally adjacent pixels), it is necessary to additionally provide a circuit such as a line memory for holding the signals. Furthermore, since the pixels are generally scanned in units of row or in units of column, there is a problem that both the circuit constitution and the driving method become complicated in order to add the signals in the diagonal direction.

Furthermore, U.S. Pat. No. 6,734,414 does not disclose any addition of signals supplied from diagonally adjacent pixels.

SUMMARY OF THE INVENTION

The present invention aims to provide an image pickup apparatus which can easily perform addition of signals from adjacent pixels in a diagonal direction, and an image pickup system which uses the image pickup apparatus.

The present invention is characterized by an image pickup apparatus which is equipped with a pixel group in which unit pixel groups are arranged in a matrix form, wherein each unit pixel group comprises plural pixels which include photoelectric conversion units and transfer transistors for transferring signal charges from the photoelectric conversion units, and an impurity diffusion region for accumulating the signal charges, an amplification transistor for outputting signals based on the signal charges accumulated in the impurity diffusion region, and a reset transistor for resetting potential of the impurity diffusion region, which are commonly provided for the pixels arranged in a direction along a column. Here, with respect to the plural unit pixel groups mutually adjacent in a direction along a row, control lines for controlling the transfer transistors respectively corresponding to the adjacent two photoelectric conversion units are alternately connected to an odd row and an even row in the row direction.

According to the present invention, the common amplification constitution is provided for the pixels of the plural rows in each column, and the transfer control lines are connected in the row direction to the odd-row pixels and the even-row pixels alternately. For this reason, it is possible to simultaneously read the signal charges of the diagonally adjacent pixels without increasing the wiring necessary to drive the pixels, and it is thus possible to easily perform the addition of the signal charges of the diagonally adjacent pixels.

Further features of the present invention will become apparent from the following description of the exemplary embodiments with reference to the attached drawings.

BRIEF DESCRIPTION OF THE DRAWINGS

FIG. 4 is a view for describing a method of reading out pixel signals in a time of a non-addition mode.

FIG. 5 is a timing chart for describing the method of reading out the pixel signals in a time of the non-addition mode.

DESCRIPTION OF THE EMBODIMENTS

Figure 1:
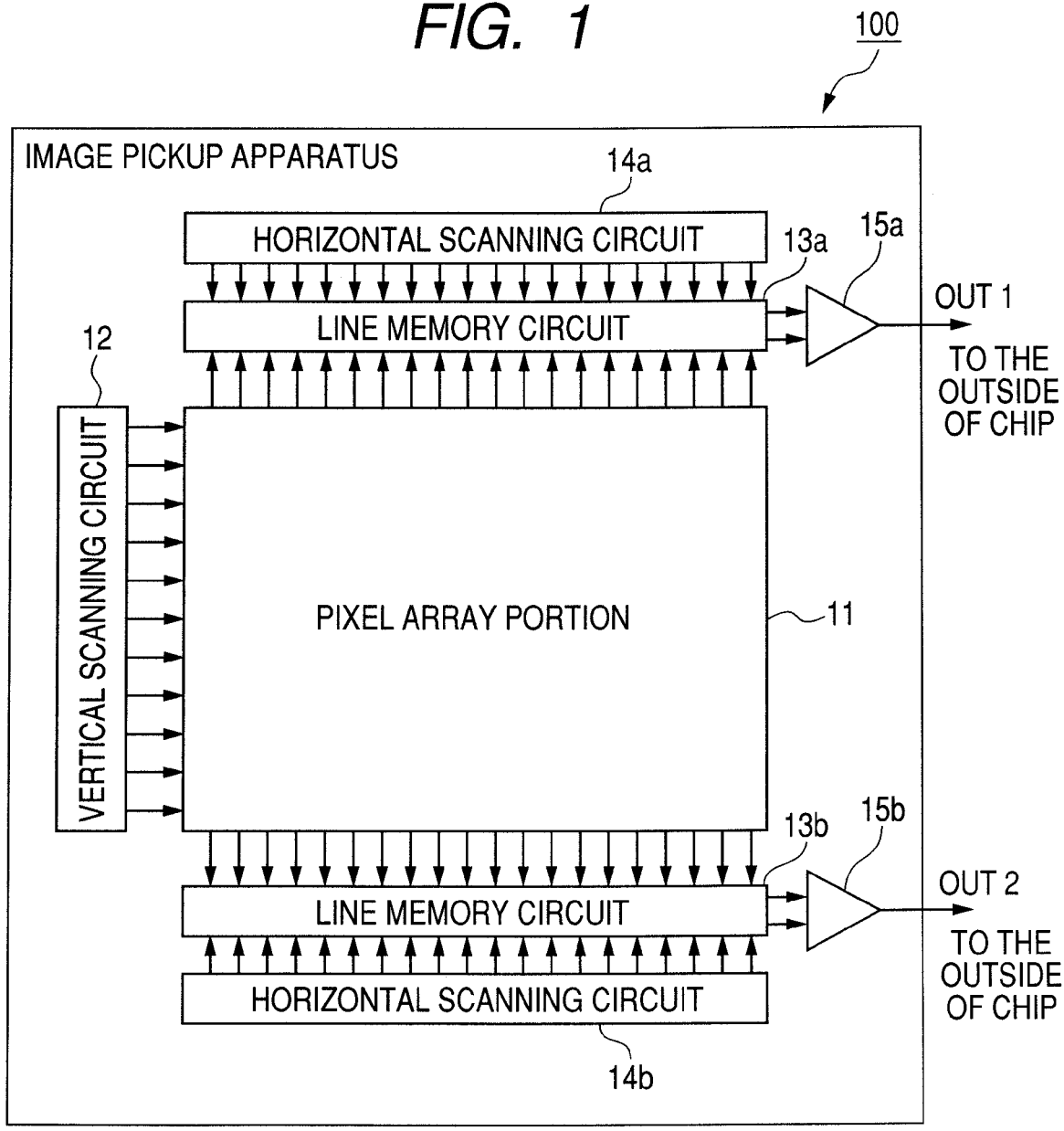
FIG. 1 is a block diagram indicating an embodiment of an image pickup apparatus according to the present invention.

Hereinafter, the exemplary embodiments of the present invention will be described with reference to the attached drawings. FIG. 1 is a block diagram indicating an embodiment of an image pickup apparatus according to the present invention. This image pickup apparatus is also called a solid image pickup apparatus or a CMOS (Complementary Metal Oxide Semiconductor) image sensor. In FIG. 1, an image pickup apparatus 100 has a pixel array portion 11, a vertical scanning circuit 12, line memory circuits 13a and 13b serving as line memory units, horizontal scanning circuits 14a and 14b, output amplifiers 15a and 15b. Plural line memory units and other plural parts are included.

As apparent from FIG. 1, the illustrated image pickup apparatus 100 has two output systems, that is, one is a system of outputting signals through the line memory circuit 13a and the output amplifier 15a and the other is a system of outputting signals through the line memory circuit 13b and the output amplifier 15b.

In the pixel array portion 11, plural unit pixel groups are two-dimensionally arranged in row and column directions, that is, arranged in a matrix form. Each of the unit pixel groups is constituted by including plural pixels, and typically, one pixel corresponds to one row (or line). In addition, the pixel array portion 11 has the two-dimensionally arranged color filters (not illustrated). The color filters are respectively arranged on each of the pixels.

Here, a 2×2 matrix arrangement (that is, a matrix having two rows and two columns) is handled as one unit, where G filters cover half area of the one unit, that is, the G filters are arranged on two pixels positioned on a diagonal line and an R filter and a B filter cover a remaining half area of the one unit, that is, the R filter and the B filter are respectively arranged on each of the pixels, to form a Bayer arrangement. Hereinafter, the pixels, on which the G filter, the R filter and the B filter are arranged, are respectively called a G pixel, an R pixel and a B pixel.

Figure 2:
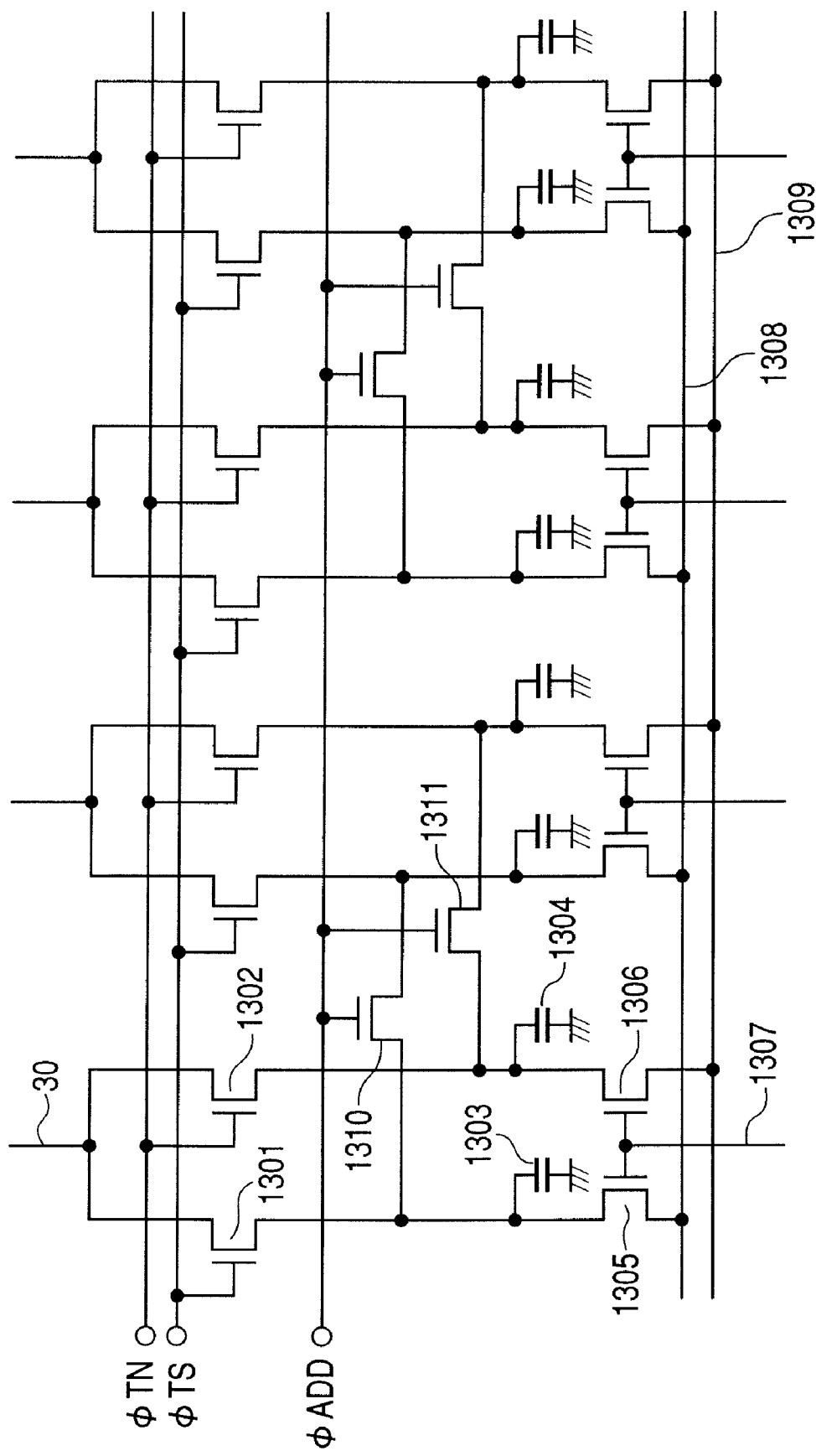
FIG. 2 is a circuit diagram indicating a constitutional example of a line memory circuit.

A constitutional example of the line memory circuit 13a is illustrated in FIG. 2. A vertical signal line 30, to which signals from the pixel array portion 11 are transmitted, is typically provided corresponding to a pixel column of the pixel array portion and is connected to holding capacitors 1303 and 1304 through switches 1301 and 1302. Signals read out from the pixel array portion are held in the respective holding capacitors 1303 and 1304.

When a switch 1310 is set to become conductive by a signal φADD, a couple of the holding capacitors 1303 for two columns connected by the switch 1310 are electrically connected to each other, and signals held in the two capacitors are added (averaged) And, when a switch 1311 is set to become conductive by the signal φADD, a couple of the holding capacitors 1304 for two columns connected by the switch 1311 are electrically connected to each other, and signals held in the two capacitors are added (averaged).

In this manner, a function of adding the signals in adjacent columns can be realized by the line memory circuit 13a. When switches 1305 and 1306 are turned on by a signal input from the horizontal scanning circuit 14a through a control line 1307, the signals held in the holding capacitors 1303 and 1304 are respectively output to horizontal signal lines 1308 and 1309. The signals output to the horizontal signal lines 1308 and 1309 are input to the output amplifier 15a serving as an output unit (not illustrated). The constitution of the line memory circuit 13b is also same as that of the line memory circuit 13a.

The horizontal scanning circuit 14a sequentially selects signals stored in the line memory circuit 13a. The signals of columns selected by the horizontal scanning circuit 14a are output to the horizontal signal lines 1308 and 1309, and a difference signal between those signals is output from the output amplifier 15a.

The above-described constitution is merely a constitutional example of the image pickup apparatus, and the present invention is not limited to this case. For example, an output system constituted by including the line memory circuit 13a, the output amplifier 15a and the like may be one system or three systems or more.

When the signals held in the respective line memory circuits 13a and 13b are output from the respective output systems, a time required to output can be shortened by outputting at least a part of the signals in parallel. If all the signals are output in parallel within a same period, especially, an effective result is obtained.

Figure 3:
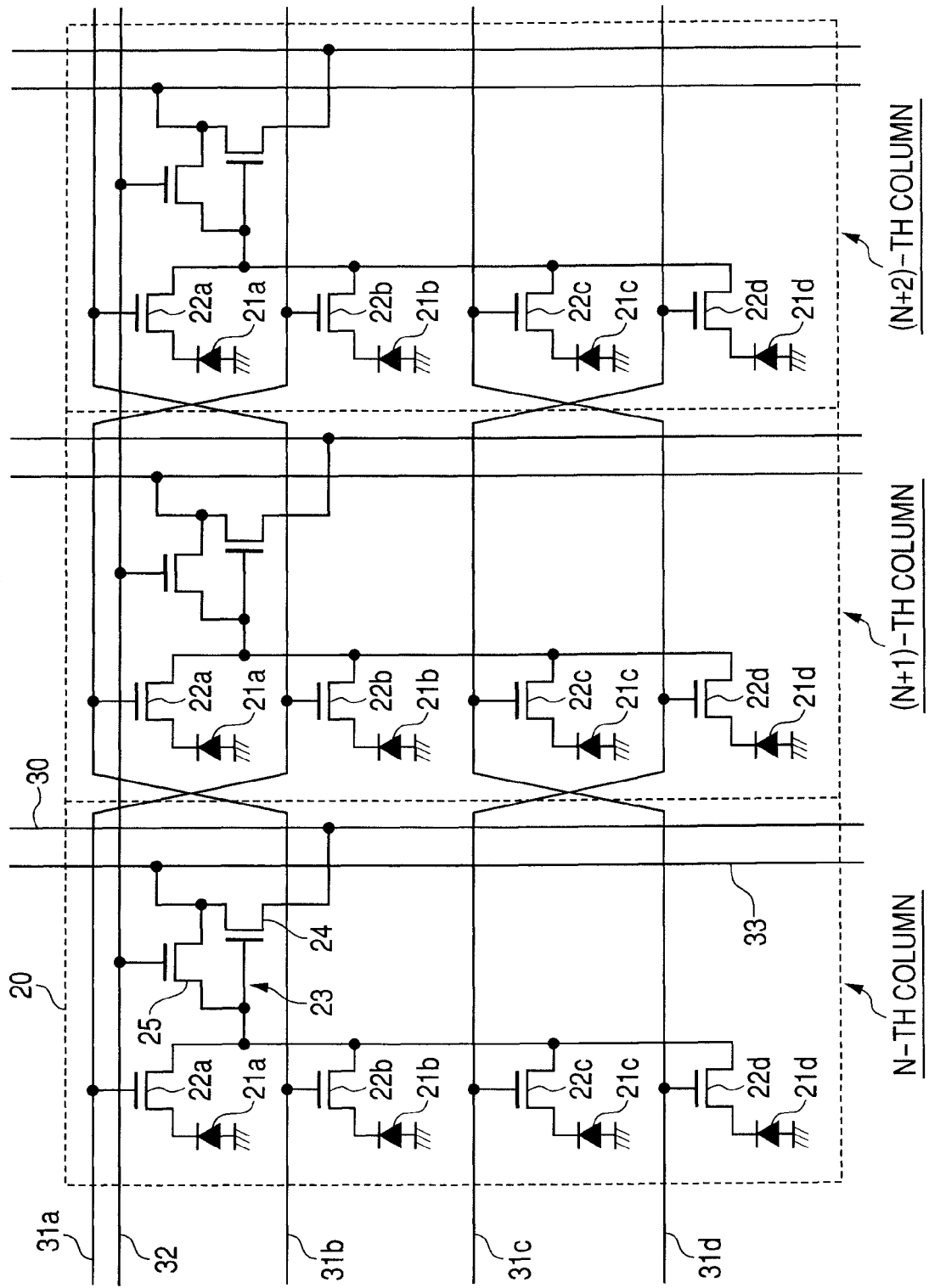
FIG. 3 is a circuit diagram indicating a constitutional example of unit pixel groups.

FIG. 3 is a circuit diagram indicating a constitutional example where three unit pixel groups are arranged in the row direction. Each unit pixel group 20 includes, for example, plural photoelectric conversion units 21a to 21d and plural transfer transistors 22a to 22d as circuit elements. In addition, each unit pixel group 20 includes one impurity diffusion region (Floating Diffusion; called an FD hereinafter) 23, one amplification transistor 24 and one reset transistor 25. In FIG. 3, a constitutional example, where each unit pixel group 20 includes the four photoelectric conversion units 21a to 21d and the four transfer transistors 22a to 22d, that is, includes four pixels, is exemplified.

Each unit pixel group 20 further includes the above-described signal output line 30, transfer control lines 31a to 31d and a reset signal line 32. The signal output line 30 is typically used in common by the plural unit pixel groups 20 within the same column. The reset signal line 32 is typically used in common by the plural unit pixel groups 20 arranged in the row direction.

In the present embodiment, respective drains of the plural transfer transistors 22a to 22d are mutually connected to form one FD 23. According to this constitution, an area of the photoelectric conversion unit per one pixel can be enlarged and an aperture ratio can be increased.

As for the photoelectric conversion units 21a to 21d, anodes are connected to the ground, and these photoelectric conversion units accumulate the charge by photo-electrically converting the incident light to the charge according to its amount. The transfer transistors 22a to 22d transfer the signal charge generated in the corresponding photoelectric conversion units to the FD 23. More particularly, as for the transfer transistors 22a to 22d, sources are connected to cathodes of the corresponding photoelectric conversion units 21a to 21d, gates are connected to the corresponding transfer control lines 31a to 31d and drains are connected to the FD 23 and a gate of the amplification transistor 24.

The transfer transistors 22a to 22d are arranged between the plural photoelectric conversion units 21a to 21d and the gate electrode of the amplification transistor 24. When the potential of the transfer control lines 31a to 31d becomes high level, the charge accumulated in the photoelectric conversion units 21a to 21d are transferred to the FD 23. The FD 23 accumulates the signal charge transferred from the photoelectric conversion units 21a to 21d through the respectively corresponding transfer transistors. Here, a process of adding the signal charges can be executed by simultaneously transferring the charges accumulated in the plural photoelectric conversion units to the FD 23.

As for the amplification transistor 24, a gate is connected to the FD 23, a drain is connected to a power supply line 33 and a source is connected to the signal output line 30, and the amplification transistor 24 outputs signals to the signal output line 30 on the basis of the signal charge accumulated in the FD 23.

As for the reset transistor 25, a source is connected to the FD 23 and a gate of the amplification transistor 24, a drain is connected to the power supply line 33 and a gate is connected to the reset signal line 32. When the potential of the reset signal line 32 becomes high level, the reset transistor 25 resets the potential of the FD 23, that is, the gate potential of the amplification transistor 24 to the potential of the power supply line 33. At the same time, the photoelectric conversion units can also be reset by setting the transfer transistors to become conductive.

The transfer control line 31a is connected to the transfer transistor 22a in the unit pixel group of an N-th column and is connected to the transfer transistor 22b in the unit pixel group of a (N+1)-th column. In addition, the transfer control line 31a is connected to the transfer transistor 22a in the unit pixel group of a (N+2)-th column, that is, the transfer control line 31a is alternately connected to the odd row and the even row in the row direction.

Similarly, the transfer control lines 31b to 31d are also connected to each of the transfer transistors alternately at every odd row and even row in the row direction. That is, the two transfer control lines for driving the transfer transistors of adjacent pixels in the unit pixel group are connected to the transfer transistors alternately at every odd row and even row in the pixel row direction.

Next, a method of reading out pixels in the image pickup apparatus according to the present embodiment will be described as to operations for a case of reading out the pixels without executing an adding process (hereinafter, described as "in a time of a non-addition mode") and a case of reading out the pixels by executing an adding process (hereinafter, described as "in a time of an addition mode") with reference to FIGS. 4 to 8.

Figure 6:
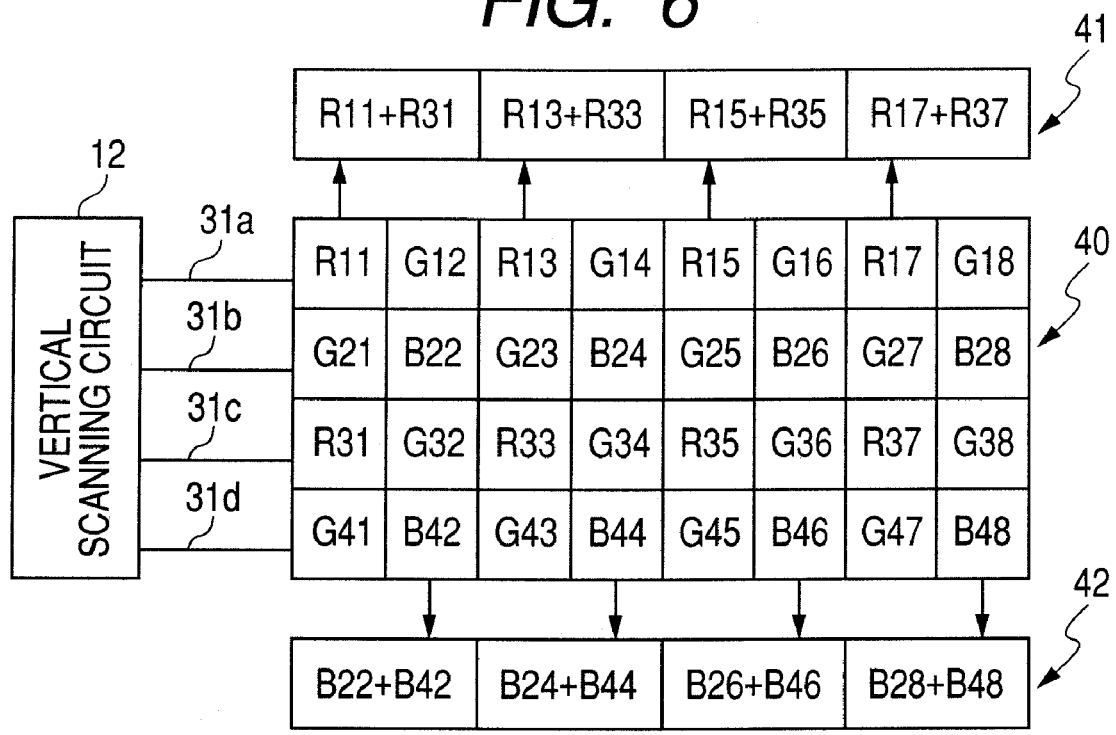
FIG. 6 is a view for describing a method of reading out pixel signals in a time of an addition mode.
Figure 7:
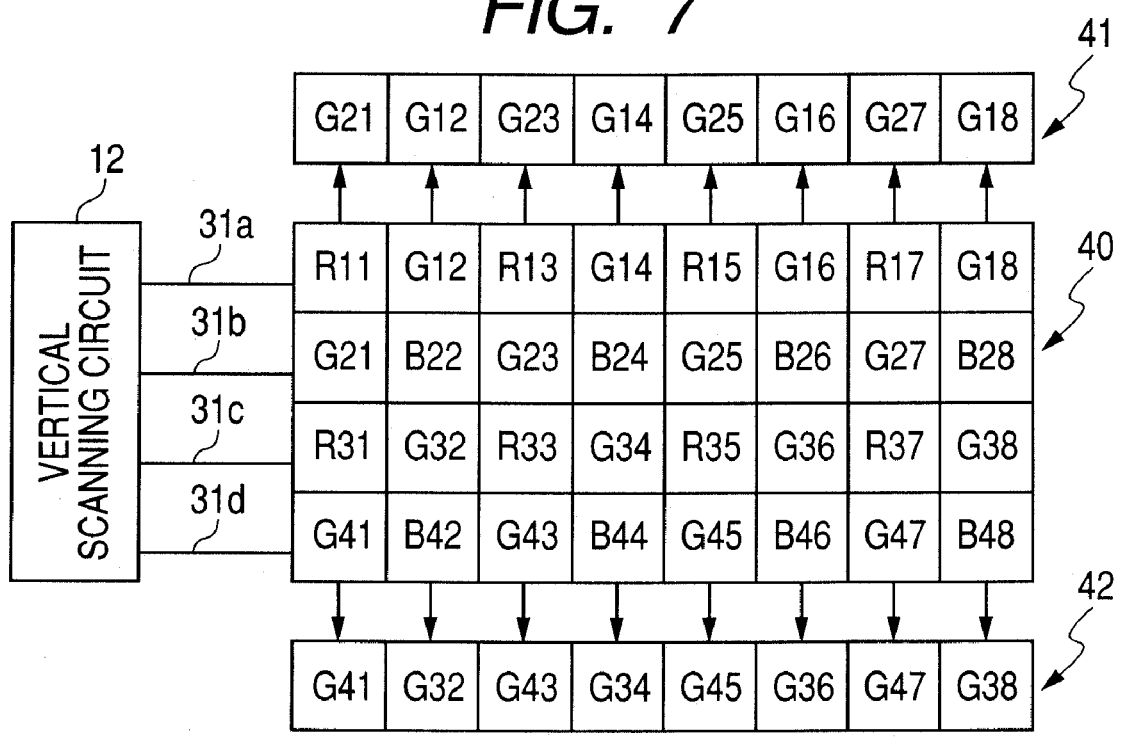
FIG. 7 is a view for describing the method of reading out the pixel signals in a time of the addition mode.

FIGS. 4, 6 and 7 are views for describing a method of reading out pixels. Reference numeral 40 denotes a pixel array portion. Here, a constitutional example of 8×4 pixels is indicated. Reference symbols G, R and B in the pixel array portion 40 respectively denote G pixels, R pixels and B pixels. Reference numerals 41 and 42 denote line memory circuits. Reference symbols 31a to 31d denote the transfer control lines which correspond to the same reference symbols 31a to 31d in FIG. 3.

Note that the pixel array portion 40 corresponds to the pixel array portion 11 in FIG. 1 and the line memory circuits 41 and 42 correspond to the line memory circuits 13a and 13b in FIG. 1. Pixels of R11, G21, R31 and G41 in the N-th column in FIGS. 4, 6 and 7 respectively correspond to the photoelectric conversion units 21a, 21b, 21c and 21d in FIG. 3. Other columns are similar to the above-described row as to the constitution. In addition, pixels of (R11, G12, G21 and B22), pixels of (R31, G32, G41 and B42) and the like illustrated in FIGS. 4, 6 and 7 indicate the pixel arrangement according to the 2×2 Bayer arrangement of the present embodiment.

Figure 8:
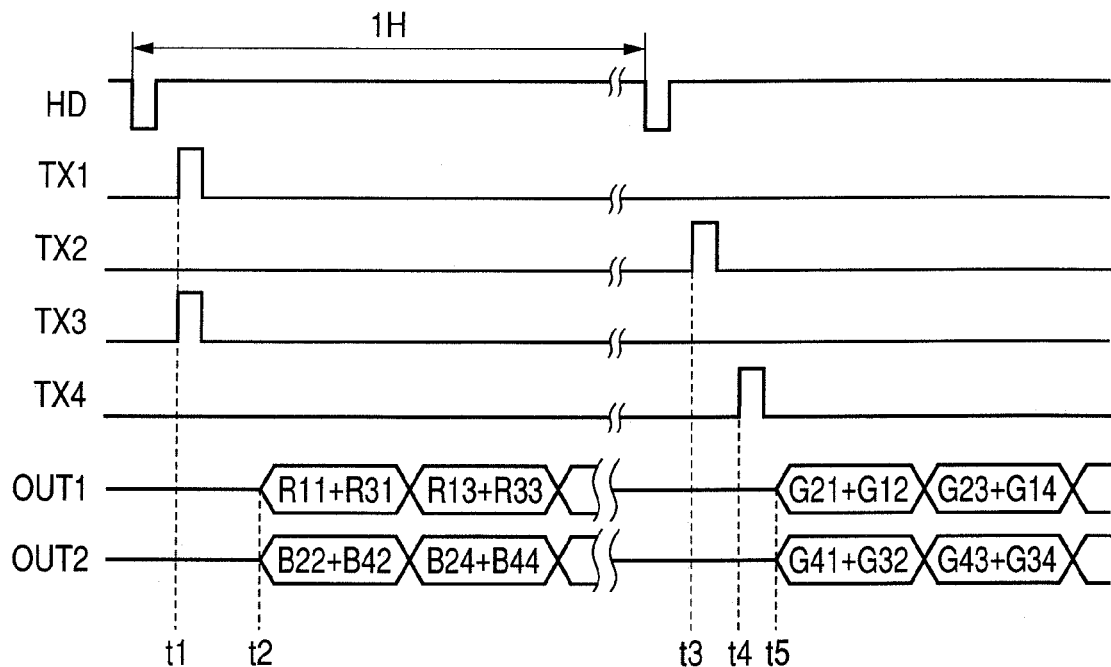
FIG. 8 is a timing chart for describing the method of reading out the pixel signals in a time of the addition mode.

FIGS. 5 and 8 are views indicating timings of the signal charge transfer of the pixels and output signals from the pixels. FIG. 5 indicates an operation in a time of the non-addition mode, and FIG. 8 indicates an operation in a time of the addition mode. An HD is a horizontal synchronization signal to be output from a timing generation unit 1008 to be described later. TX1 to TX4 are transfer pulses to be applied to the transfer control lines 31a to 31d illustrated in FIGS. 4, 6 and 7 from the vertical scanning circuit 12. Here, a case of having two output systems is indicated. Reference symbols OUT1 and OUT2, which correspond to the OUT1 and the OUT2 in FIG. 1, are output signals from the pixels. Reference symbol 1H denotes one horizontal scanning period.

Next, a method of reading out pixels in a time of the non-addition mode in the present embodiment will be described with reference to FIGS. 4 and 5. As illustrated in FIG. 5, when the potential of the transfer pulse TX1 becomes high level at a time t1, a signal of the pixel for one row connected to the transfer control line 31a is output to the signal output line 30. A signal output at this time is read out to the line memory circuit 41 at a switch (not illustrated). That is, signals are simultaneously output from the pixels of arranging R filters and the pixels of arranging B filters in the unit pixel groups adjacent in the row direction connected to one common control line by the respective amplification transistors.

When the potential of the transfer pulse TX2 becomes high level at a time t2, a signal of the pixel for one row connected to the transfer control line 31b is output to the signal output line 30. That is, signals are simultaneously output from the pixels of arranging G filters adjacent in the diagonal direction in the unit pixel groups connected to the above-described one common control line by the amplification transistors of the respective unit pixel groups. A signal output at this time is read out to the line memory circuit 42 connected another output system at a switch (not illustrated).

In the present embodiment, the transfer control line of the pixels is connected to each of the transfer transistors alternately at every odd row and even row in the row direction as described above. Therefore, pixel signals read out to the line memory circuits 41 and 42 at a time t3 are of pixels of R11, B22, R13 and successive pixels and pixels of G21, G12, G23 and successive pixels as illustrated in FIG. 4. After the time t3, pixel signals are output by the horizontal scanning circuits 14a and 14b illustrated in FIG. 1, and the pixels of R11, B22, R13 and successive pixels are output to the OUT1 and the pixels of G21, G12, G23 and successive pixels are output to the OUT2 sequentially.

Similarly, pixel signals are read out to the line memory circuit 41 at a time t4 and pixel signals are read out to the line memory circuit 42 at a time t5, and after a time t6, pixels of R31, B42, R33 and successive pixels are output to the OUT1 and pixels of G41, G32, G43 and successive pixels are output to the OUT2 sequentially.

In this manner, in the non-addition mode, the pixels with G filters adjacent in the diagonal direction of plural pixels, the pixel with R filter and the pixel with B filter adjacent in the other diagonal direction are independently read out.

In the present embodiment, G pixels (G21, G12, G23 and successive pixels) adjacent in the diagonal direction can be read out to the same output system, that is, the line memory circuit 42 and an output system connected to that line memory circuit. Therefore, the difference of output magnitude between G pixel signals caused by the difference of output system does not occur. If outputs are considerably different in G pixel signals, a pattern called a false color is generated in a signal process to be executed in a subsequent stage. However, generation of this false color can be suppressed in the present embodiment.

According to the above-described constitution, for example, in case of photographing a still image, a high-resolution image can be obtained by setting the non-addition mode.

Next, a method of reading out pixels in a time of the addition mode according to the present embodiment will be described with reference to FIGS. 6 and 8. The HD, TX1 to TX4, OUT1 and OUT2 illustrated in FIG. 8 are similarly handled to those described in FIG. 5. As illustrated in FIG. 8, when the potentials of the transfer pulses TX1 and TX3 become high level at a time t1, signals of pixels connected to the transfer control lines 31*a* and 31*c* are added up on the FD to be read out to the line memory circuits.

FIG. 6 indicates pixel signals being read out to the line memory circuits 41 and 42 at a time t2. Here, a case that pixel signals are read out by assigning the R pixel signals of the odd columns to the line memory circuit 41 and assigning the B pixel signals of the even columns to the line memory circuit 42 is indicated. That is, two control lines for two pixels of arranging R filters or two pixels of arranging B filters included in one unit pixel group are simultaneously controlled, and the signal charges of the two pixels of arranging the same color filters are simultaneously transferred to the FD to be added. After the time t2, pixel signals are output by the horizontal scanning circuits 14*a* and 14*b* and then pixel signals of R11+R31, R13+R33 and successive pixels are output to the OUT1 and pixels of B22+B42, B24+B44 and successive pixels are output to the OUT2 sequentially.

Next, as illustrated in FIG. 8, when the potential of the transfer pulse TX2 becomes high level at the time t3, a signal of G pixel connected to the transfer control line 31*b* is read out to the line memory circuit 41. And, when the potential of the transfer pulse TX4 becomes high level at the time t4, a signal of G pixel connected to the transfer control line 31*d* is read out to the line memory circuit 42.

FIG. 7 indicates signals being read out to the line memory circuits 41 and 42 at the time t5. In the present embodiment, the line memory circuits 41 and 42 have functions of adding signals from adjacent two pixels. Therefore, after the time t5, pixel signals of G21+G12, G23+G14 and successive pixels serving as added signals of couple pixels adjacent in the diagonal direction are output to the OUT1, and pixels of G41+G32, G43+G34 and successive pixels serving as added signals of couple pixels adjacent in the other diagonal direction are output to the OUT2 sequentially.

In the related background art, when signals from two adjacent pixels are added in the line memory circuits, information of different colors are to be added, and color information can not be maintained. In order to perform an addition of the same color, an addition of skipping one pixel of the adjacent same color is required, and a negative effect such as a cross talk or the like due to the increase of a circuit area or the intersection of wirings is generated. According to the present embodiment, since the addition of signals from two adjacent pixels is performed, a circuit layout is resulted in simple structure and influence by the cross talk can be reduced to a sufficient small level.

In the present embodiment, two pixels of the same color in the vertical direction can be added by simultaneously transferring the signal charges of pixels of arranging the same color filters. In addition, the G pixels adjacent in the diagonal direction can be simultaneously transferred by alternately connecting the transfer control line to each of the transfer transistors at every odd row and even row in the row direction. Therefore, signals of the G pixels adjacent in the diagonal direction can be added within the line memory circuit without increasing the line memory.

Figure 9:
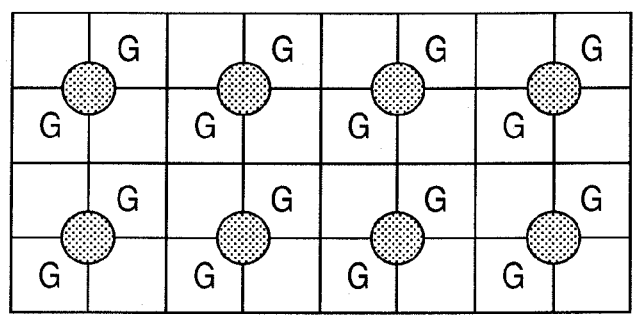
FIG. 9 is a view indicating a spatial location of image information according to G Pixels in a time of the addition mode.
Figure 10:
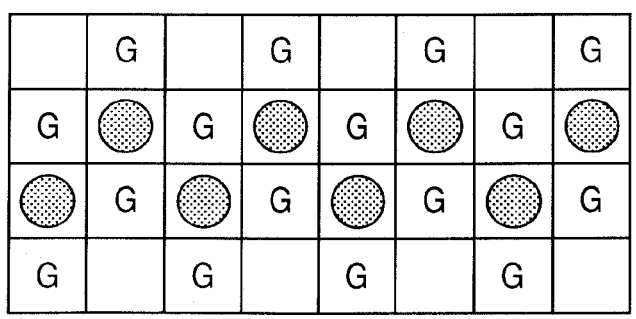
FIG. 10 is a view indicating a spatial location of image information according to the related background art.

According to the above-described constitution, in R pixels and B pixels, the addition of two pixels in the vertical direction, that is, in the column direction can be performed, and in G pixels, the addition of two adjacent pixels in the diagonal direction can be performed. Since median points of G pixels, which were added in a time of the addition mode, are located on positions marked by black dots as illustrated in FIG. 9, it becomes possible to produce spatial same intervals. Such a problem in the related background art, where signal median points after performing the addition become a state of spatially different intervals (black dots marked in FIG. 10) in the addition performed only in the vertical direction, can be solved.

As above described, for example, in case of photographing a moving image, a high-quality image can be obtained by setting to the addition mode.

It is preferable that the transfer transistors 22*a* to 22*d*, the amplification transistor 24 and the reset transistor 25 are constituted by N-type MOS transistors, however, those transistors may be constituted by P-type MOS transistors.

Figure 11:
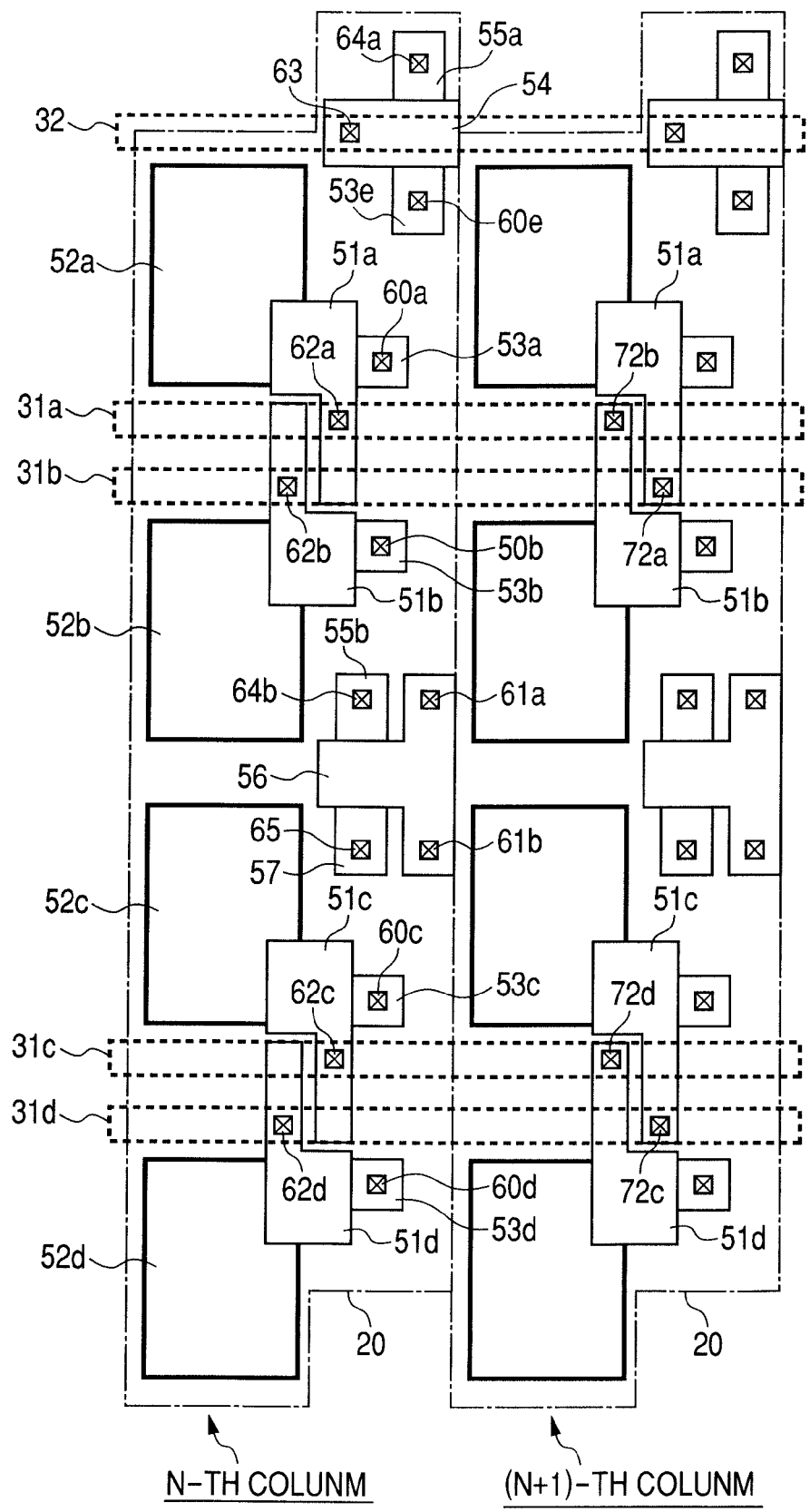
FIG. 11 is a plane pattern view indicating a structural example of unit pixel groups.

FIG. 11 is a plane pattern view (layout view) indicating a structural example of the unit pixel groups illustrated in FIG. 3. In FIG. 11, the same parts as those in FIG. 3 are denoted by the same reference numerals or symbols. In FIG. 11, gate electrodes 51*a* to 51*d* are respectively arranged between photoelectric conversion regions (active areas) 52*a* to 52*d* of the photoelectric conversion units 21*a* to 21*d* and FDs 53*a* to 53*d* to form gate electrodes of the transfer transistors 22*a* to 22*d*.

The FDs 53*a* to 53*d* are respectively drain areas of the transfer transistors 22*a* to 22*d*. A gate electrode 56, a source area 57 and a drain area 55*b* constitute the amplification transistor 24. A gate electrode 54, a source area 53*e* and a drain area 55*a* constitute the reset transistor 25.

The gate electrodes 51*a* to 51*d*, 54 and 56 are constituted by, for example, the polysilicon. The gate electrodes 51*a* to 51*d* of the transfer transistors 22*a* to 22*d* in the N-th column are respectively connected to the transfer control lines 31*a* to 31*d* serving as conduction lines through contact portions 62*a* to 62*d*. The gate electrode 54 of the reset transistor 25 is connected to a reset signal line 32 serving as a conduction line through a contact portion 63.

The FDs 53*a* to 53*d* in the N-th column, the gate electrode 56 of the amplification transistor 24 and the source area 53*e* of the reset transistor 25 are electrically connected through contact portions 60*a* to 60*d*, 61*a*, 61*b* and 60*e* and conduction lines (not illustrated) to be utilized as the FD 23. The drain area 55*a* of the reset transistor 25 and the drain area 55*b* of the amplification transistor 24 are connected to a power supply line 33 serving as a conduction line (not illustrated) through contact portions 64*a* and 64*b*. The source area 57 of the amplification transistor 24 is connected to the signal output line 30 serving as a conduction line (not illustrated) through a contact portion 65.

In a unit pixel group of the (N+1)-th column, the gate electrodes 51*a*, 51*b*, 51*c* and 51*d* of the transfer transistors are respectively connected to the transfer control lines 31*a*, 31*b*, 31*c* and 31*d* serving as conduction lines through contact portions 72*b*, 72*a*, 72*d* and 72*c*. That is, as apparent from FIG. 11, connection of the transfer control line with the transfer transistor is inverted for a unit pixel group of the N-th column, and the transfer control line of the pixel is connected to each of the transfer transistors alternately at every odd row and even row in the row direction as described above.

In the present embodiment, the configuration formed by one photoelectric conversion region 52*a* and the FD 53*a* connected with that photoelectric conversion region is mirror symmetry with the configuration formed by another one photoelectric conversion region 52*b* and the FD 53*b* connected with that photoelectric conversion region. Similarly, the configuration formed by the photoelectric conversion region 52*c* and the FD 53C is also mirror symmetry with the configuration formed by the photoelectric conversion region 52*d* and the FD 53*d*.

If adopting such the mirror symmetrical arrangement, length of a conduction line used for connecting plural FDs within a unit cell to a gate of the amplification transistor in common can be shortened as compared with a case of the translational symmetrical arrangement. Thereby, a degree of freedom of layout of the amplification transistor, the reset transistor and etc, in each unit cell can be improved.

In FIG. 11, the alternate connection with the gate electrodes of the transfer transistors at every odd row and even row is realized by constituting all the transfer control lines by the same layer conduction line and changing positions of contacts. However, it is not limited to this structure. For example, two transfer control lines may be constituted by different layer conduction lines.

Figure 12:
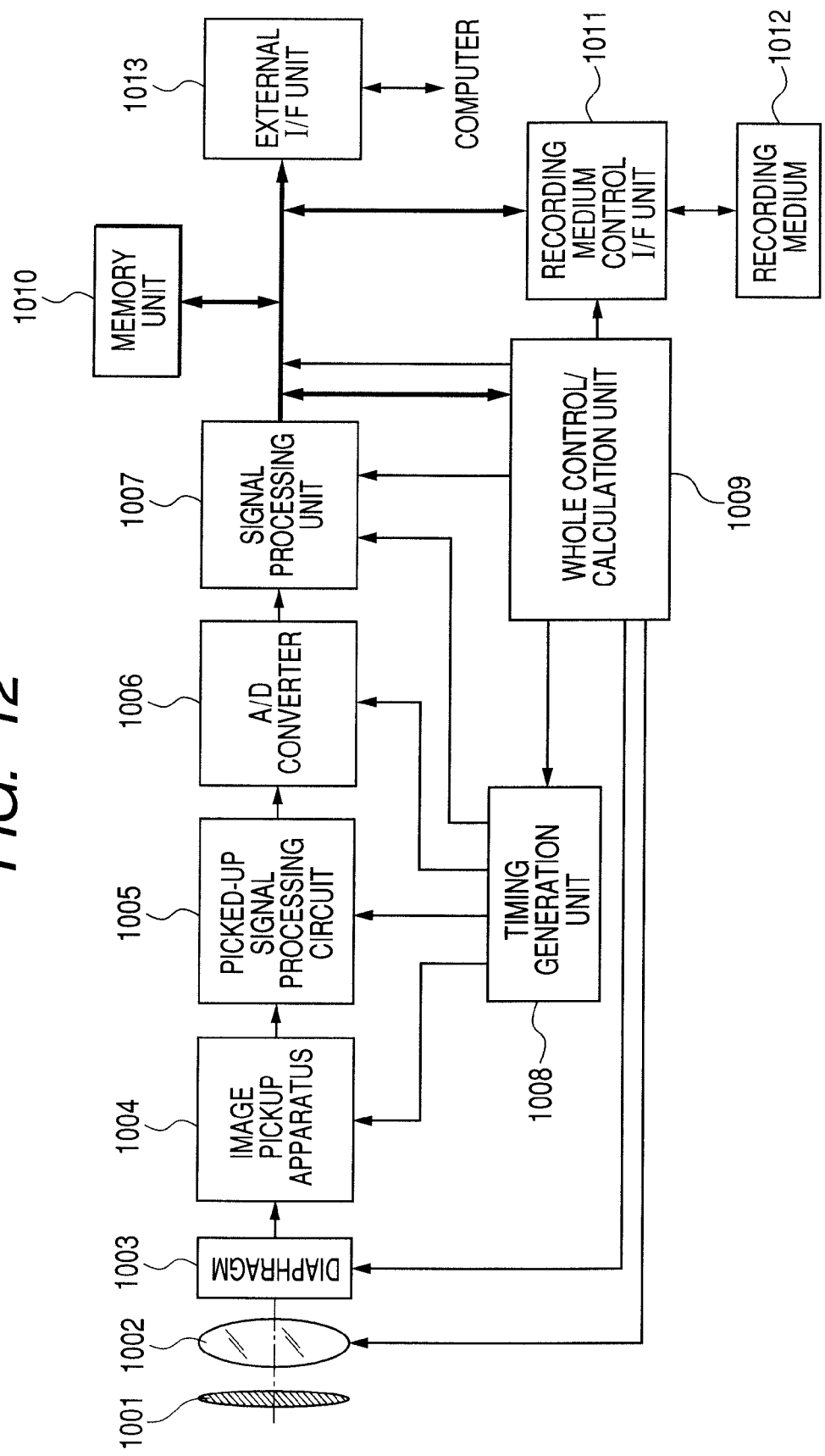
FIG. 12 is a view indicating an embodiment of an image pickup system which uses an image pickup apparatus of the present invention.

FIG. 12 is a view indicating an embodiment of an image pickup system by using an image pickup apparatus of the present invention. An image pickup system 400 has an image pickup apparatus 1004 related to the present invention as above described. An optical image of a photographic subject is imaged on an imaging area of the image pickup apparatus 1004 by an optical lens 1002. A barrier 1001 serving as a protect function of the lens 1002 and a main switch is provided on an outside of the lens 1002.

A diaphragm 1003 used for adjusting the amount of light emitted through from the lens 1002 is provided at the lens 1002. Various corrections and a process such as a clamp process or the like are executed by a picked-up signal processing circuit 1005 to image pickup signals to be output with plural channels from the image pickup apparatus 1004. Image pickup signals to be output with plural channels from the picked-up signal processing circuit 1005 are analog-to-digital converted by an A/D converter 1006.

Various corrections and the data compression or the like are performed to image data which was output from the A/D converter 1006 by a signal processing unit 1007. The image pickup apparatus 1004, the picked-up signal processing circuit 1005, the A/D converter 1006 and the signal processing unit 1007 are operated in accordance with a timing signal generated by a timing generation unit 1008.

The blocks 1005 to 1008 may be formed on the same chip with the image pickup apparatus. Each of the blocks in the image pickup system 400 is controlled by a whole control/calculation unit 1009. The image pickup system 400 has a memory unit 1010 used for temporarily storing image data and a recording medium control interface (I/F) unit 1011 used for recording the image data to a recording medium 1012 and reading out the recorded image data. The detachable recording medium 1012 is constituted by including a semiconductor memory and the like. The image pickup system 400 may have an external interface (I/F) unit 1013 used for communicating with an external computer.

Next, an operation of the image pickup apparatus 400 illustrated in FIG. 12 will be described. Initially, responding to an opening of the barrier 1001, a main power, a power of a control system and a power of an image pickup system circuit such as the A/D converter 1006 or the like are sequentially turned on. Thereafter, the whole control/calculation unit 1009 sets the diaphragm 1003 open in order to control the exposure amount. A Signal output from the image pickup apparatus 1004 is supplied to the A/D converter 1006 passing through the picked-up signal processing unit 1005.

The A/D converter 1006 performs an A/D conversion to that signal and outputs the A/D converted signal to the signal processing unit 1007. The signal processing unit 1007 processes that converted data and supplies the processed data to the whole control/calculation unit 1009, and a calculation of determining the exposure amount is performed in the whole control/calculation unit 1009. The whole control/calculation unit 1009 controls the diaphragm 1003 on the basis of the determined exposure amount.

Next, the whole control/calculation unit 1009 extracts a high frequency component from the signal, which was output from the image pickup apparatus 1004 and processed in the signal processing unit 1007, and distance to the photographic subject is calculated on the basis of the high frequency component. Thereafter, the lens 1002 is driven to judge whether or not an image is focused. When it is judged that the image is not focused, the lens 1002 is driven again to calculate the distance.

After confirming that the image was focused, a real exposure is started. After terminating the exposure, a correction or the like is performed to an image pickup signal, which was output from the image pickup apparatus 1004, in the picked-up signal processing unit 1005, then the image pickup signal is A/D converted in the A/D converter 1006 and processed in the signal processing unit 1007. The image data, which was processed in the signal processing unit 1007, is accumulated in the memory unit 1010 by the whole control/calculation unit 1009.

Thereafter, the image data, which was accumulated in the memory unit 1010, is recorded in the recording medium 1012 through the recording medium control I/F unit 1011 by a control of the whole control/calculation unit 1009. And, the image data is supplied to an external computer through an external I/F unit 1013 and is then processed.

The switching of the diving modes described in the above can be realized by a manner that, for example, signals to be supplied to each of sections from the timing generation unit 1008 are switched in accordance with a procedure of operating an operation unit (not illustrated).

An image pickup system of the present invention can be preferably used as, for example, a digital still camera, a video camera or a camera module mounted on a terminal device such as a mobile-phone.

While the present invention has been described with reference to the exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-047664, filed Feb. 28, 2008, which is hereby incorporated by reference herein in its entirety.

What is claimed is:

1. An image pickup apparatus which is equipped with a pixel group in which unit pixel groups are arranged in a matrix form, wherein each unit pixel group comprises:

plural pixels which include photoelectric conversion units and transfer transistors for transferring signal charges from the photoelectric conversion units, and an impurity diffusion region for accumulating the signal charges, an amplification transistor for outputting signals based on the signal charges accumulated in the impurity diffusion region, and a reset transistor for resetting potential of the impurity diffusion region, which are commonly provided for the pixels arranged in a direction along a column, wherein, with respect to the plural unit pixel groups mutually adjacent in a direction along a row, control lines for controlling the transfer transistors respectively corresponding to two adjacent photoelectric conversion units are alternately connected to an odd row and an even row in the direction along the row.

2. An image pickup apparatus according to claim 1, wherein
- a Bayer-arranged color filter which includes R, G and B filters is provided for the plural pixels,
- the signals are simultaneously output by the amplification transistors of the unit pixel groups, from diagonally adjacent pixels to which the G filters are arranged in the unit pixel groups adjacent in the direction along the row and connected to one common control line, and
- the signals are simultaneously output by the respective amplification transistors, from the pixels to which the R filters are arranged and the pixels to which the B filters are arranged in the unit pixel groups adjacent in the direction along the row and connected to another one common control line.

3. An image pickup apparatus according to claim 2, wherein
- the image pickup apparatus further comprises plural line memory units which correspond to the pixels of one row and have holding capacitors for holding the signals output from the amplification transistors,
- only the signals from the pixels to which the G filters are arranged are held in one of the line memory units,
- only the signals from the pixels to which the R filters are arranged and the pixels to which the B filters are arranged are held in another one of the line memory units, and
- the signals held in the one line memory unit and the signals held in the other one line memory unit are respectively input to mutually different output units.

4. An image pickup apparatus according to claim 3, wherein at least a part of the signals held in the one line memory unit and a part of the signals held in the other one line memory are output in parallel.

5. An image pickup apparatus according to claim 1, wherein the image pickup apparatus comprises an addition unit adapted to add the signals output from the respective amplification transistors of at least two of the unit pixel groups.

6. An image pickup apparatus according to claim 5, wherein a Bayer-arranged color filter which includes R, G and B filters is provided for the plural pixels, and the signals sent from diagonally adjacent pixels to which the G filters are arranged in the unit pixel groups adjacent in the direction along the row are added by the addition unit.

7. An image pickup apparatus according to claim 1, wherein
- a Bayer-arranged color filter which includes R, G and B filters is provided for the plural pixels,
- two control lines for two pixels which are included in one unit pixel group and to which the R filters are arranged or two pixels which are included in the one unit pixel group and to which the B filters are arranged are simultaneously controlled, and
- the signal charges of the two pixels to which the R filters are arranged or the two pixels to which the B filters are arranged are simultaneously transferred to the impurity diffusion region.

8. An image pickup system comprising:
- an image pickup apparatus which is equipped with a pixel group in which unit pixel groups are arranged in a matrix form, wherein each unit pixel group comprises:
  - plural pixels which include photoelectric conversion units and transfer transistors for transferring signal charges from the photoelectric conversion units, and
  - an impurity diffusion region for accumulating the signal charges, an amplification transistor for outputting signals based on the signal charges accumulated in the impurity diffusion region, and a reset transistor for resetting potential of the impurity diffusion region, which are commonly provided for the pixels arranged in a direction along a column, wherein, with respect to the plural unit pixel groups mutually adjacent in a direction along a row, control lines for controlling the transfer transistors respectively corresponding to two adjacent photoelectric conversion units are alternately connected to an odd row and an even row in the direction along the row;
- an optical system which performs imaging of incident light on the image pickup apparatus; and
- a signal processing circuit which processes the signals from the image pickup apparatus.

* * * * *

UNITED STATES PATENT AND TRADEMARK OFFICE
CERTIFICATE OF CORRECTION

PATENT NO. : 8,174,599 B2  
APPLICATION NO. : 12/391305  
DATED : May 8, 2012  
INVENTOR(S) : Yukihiro Kuroda Page 1 of 1

It is certified that error appears in the above-identified patent and that said Letters Patent is hereby corrected as shown below:

TITLE PAGE, ITEM (75) INVENTORS:

"Chun-Hung Lien, Taipei (TW); Dong-Yang Lin, Yonghe (TW); and Ching-Hsung Wang, Banqjao (TW)" should be deleted.

Signed and Sealed this  
Tenth Day of July, 2012

David J. Kappos  
*Director of the United States Patent and Trademark Office*